US012700447B2

(12) United States Patent　　　　(10) Patent No.:　US 12,700,447 B2
Park　　　　　　　　　　　　　　　　　(45) Date of Patent:　　　Aug. 4, 2026

(54) SEMICONDUCTOR MEMORY DEVICES HAVING ENHANCED SUB-WORD LINE DRIVERS THEREIN

(71) Applicant: Samsung Electronics Co., Ltd., Suwon-si (KR)

(72) Inventor: Jongwook Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 34 days.

(21) Appl. No.: 18/533,788

(22) Filed: Dec. 8, 2023

(65) Prior Publication Data

US 2024/0412773 A1　　Dec. 12, 2024

(30) Foreign Application Priority Data

Jun. 7, 2023　(KR) ........................ 10-2023-0072774

(51) Int. Cl.
*G11C 11/408*　　　　(2006.01)
(52) U.S. Cl.
CPC ...... *G11C 11/4085* (2013.01); *G11C 11/4087* (2013.01)
(58) Field of Classification Search
CPC .... G11C 11/4085; G11C 11/4087; G11C 8/14
See application file for complete search history.

(56) References Cited

U.S. PATENT DOCUMENTS 6,160,753 A　*　12/2000　Shibayama .............. G11C 8/14
　　　　　　　　　　　　　　　365/189.11
8,358,535 B2　　1/2013　Chae et al.

8,379,476 B2　　2/2013　Lee et al.
9,111,633 B2　　8/2015　Kim
10,354,722 B2 *　7/2019　Ishii ..................... G11C 11/418
11,244,716 B2　　2/2022　Jeong et al.
12,272,395 B2 *　4/2025　Jung ................... H10B 12/315
2007/0206409 A1 *　9/2007　Choi ....................... G11C 8/12
　　　　　　　　　　　　　　　365/163
2011/0170344 A1　7/2011　Chae et al.
2011/0176375 A1　7/2011　Lee et al.
2011/0286262 A1 *　11/2011　Kitayama ........... G11C 11/4085
　　　　　　　　　　　　　　　365/230.06
2014/0347951 A1　11/2014　Kim
2019/0035456 A1 *　1/2019　Ishii ..................... G11C 11/419
(Continued)

FOREIGN PATENT DOCUMENTS

KR　　20040031287 A　　4/2004
KR　　20060004724 A　　1/2006
(Continued)

*Primary Examiner* — Jay W. Radke

(74) *Attorney, Agent, or Firm* — Wolf, Greenfield & Sacks, P.C.

(57)　　　　　ABSTRACT

An embodiment provides a semiconductor memory device including a first word line extending along a first direction; a sub-word line driver including a first circuit and a second circuit that are connected to the first word line and are spaced apart from each other along the first direction, wherein the first circuit is configured to drive the first word line with a first voltage, and the second circuit is configured to drive the first word line with a second voltage that is different from the first voltage; and a memory cell connected to the first word line between the first circuit and the second circuit.

20 Claims, 13 Drawing Sheets

(56) References Cited

U.S. PATENT DOCUMENTS

2021/0193213 A1     6/2021   Jeong et al.
2022/0130460 A1     4/2022   Yang
2023/0260566 A1*    8/2023   Jung .................... G11C 11/4085
                                                        365/230.06

FOREIGN PATENT DOCUMENTS

KR      20110083094  A      7/2011
KR      20110084756  A      7/2011
KR      20140136766  A      12/2014
KR      20210079436  A      6/2021

* cited by examiner

<u>1300</u>

SEMICONDUCTOR MEMORY DEVICES HAVING ENHANCED SUB-WORD LINE DRIVERS THEREIN

REFERENCE TO PRIORITY APPLICATION

This application claims priority to Korean Patent Application No. 10-2023-0072774, filed Jun. 7, 2023, the disclosure of which is hereby incorporated herein by reference.

BACKGROUND

The present invention relates to integrated circuit devices and, more particular, to integrated circuit memory devices.

A volatile semiconductor memory device such as a dynamic random access memory (DRAM) may perform a write operation or a read operation.

Recently, as the size of data stored in a memory device continues to increase and a manufacturing process for fabricating the memory device causes a reduction in device dimensions within the memory device, a distance between word lines that select a row direction of memory cells is gradually narrowed, so that each selected word line is spaced more closely to each adjacent unselected word line. As will be understood by those skilled in the art, this reduction in dimensions and spacing may cause various defects by, among other things, increasing the magnitude of electrical coupling between adjacent word lines.

SUMMARY

Embodiments of the present disclosure provide a semiconductor memory device having a sub-word line driver therein that can improve a disable time of word lines and improves a coupling effect between adjacent word lines.

One or more embodiments of the present disclosure provides a semiconductor memory device including: a first word line extending along a first direction, and a sub-word line driver including a first circuit and a second circuit that are connected to the first word line and are spaced apart from each other along the first direction. The first circuit drives the first word line with a first voltage, and the second circuit drives the first word line with a second voltage different from the first voltage. A memory cell is provided, which is connected to the first word line between the first circuit and the second circuit.

One or more embodiments of the present disclosure provides a semiconductor memory device including: a cell array including memory cell, a first word line connected to the memory cell, a first block that is disposed on one side of the cell array and includes a first circuit connected to the first word line to drive the first word line with a first voltage, and a second block that is disposed on the other side of the cell array and includes a second circuit connected to the first word line to drive the first word line with a second voltage different from the first voltage.

One or more embodiments of the present disclosure provides a memory system including: a cell array including a plurality of memory cells connected to a plurality of word lines, a memory controller outputting an address signal, a row decoder that receives the address signal and outputs a first signal that selects a first word line from among the plurality of word lines based on the address signal, and a plurality of driving signals. A first sub-word line driver is provided, which includes: a first transistor connected to one end of the first word line that applies a first voltage to the first word line based on the first signal and a first driving signal among the plurality of driving signals, a second transistor that applies a second voltage different from the first voltage to the first word line based on the first signal, and a third transistor that is connected to the other end of the first word line and applies the second voltage to the first word line based on a second driving signal complementary to the first driving signal.

According to one or more embodiments of the present disclosure, an integrated circuit memory device is provided, which includes an array of memory cells having word lines associated therewith and a plurality of sub-word line drivers. The array of memory cells is arranged into a plurality of rows of memory cells that span a plurality of columns of the array, and each of the plurality of rows has a respective word line associated therewith that spans across the array (e.g., from a first side to a second opposing side of the array). A sub-word line driver is provided that includes first and second circuits. Advantageously, the first circuit extends adjacent the first side of the array and the second circuit extends adjacent the second side of the array. The first circuit, which is electrically coupled to a first node of a word line on the first side of the array, is configured to drive the word line with a pull-up voltage when the first circuit is active. In contrast, the second circuit, which is electrically coupled to a second node of the word line on the second first side of the array, is configured to drive the word line with a pull-down voltage when the second circuit is active.

DETAILED DESCRIPTION OF THE EMBODIMENTS

Figure 1:
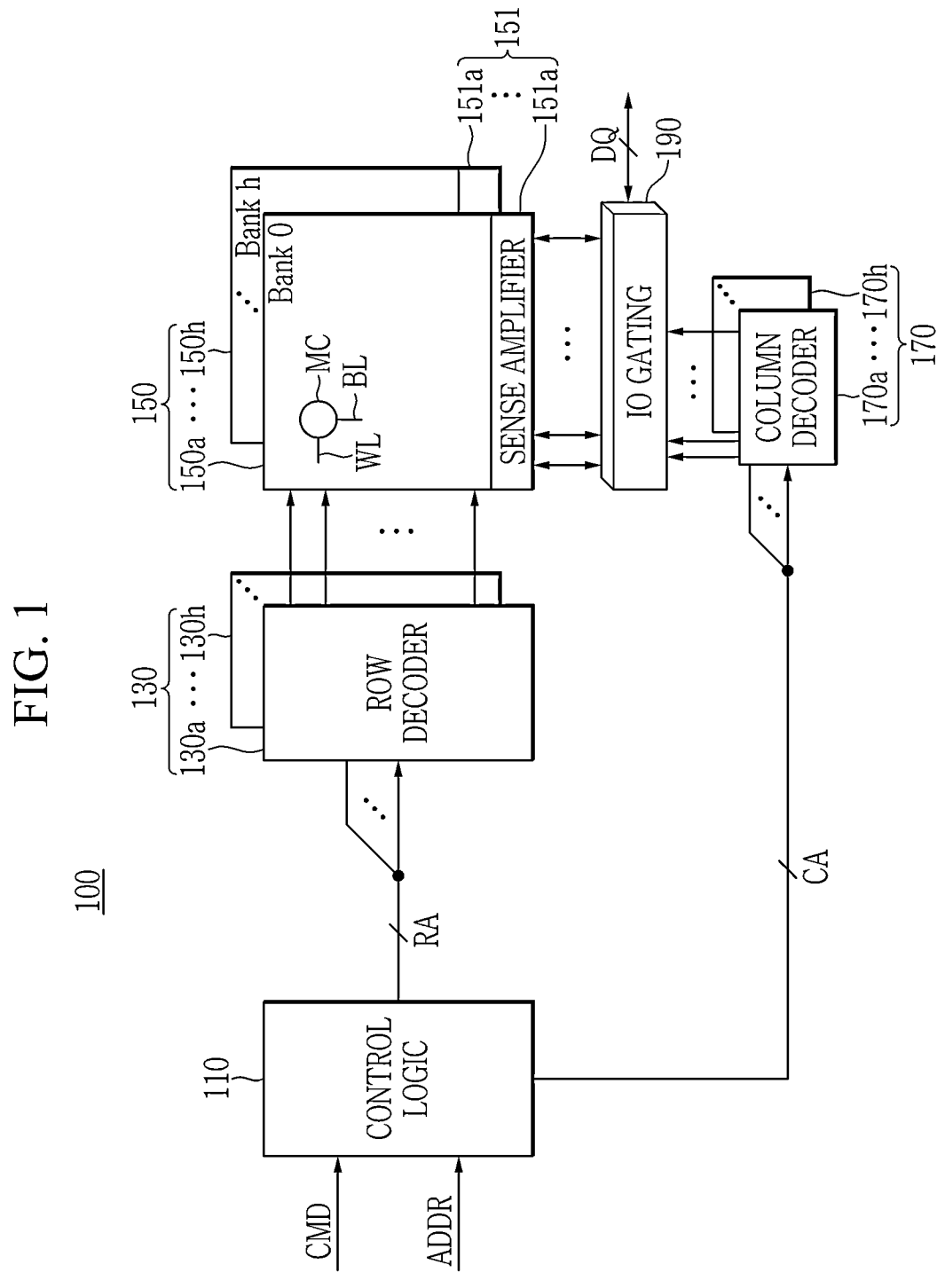
FIG. 1 illustrates a block diagram of a memory device according to an embodiment.

In the following detailed description, only certain exemplary embodiments of the present invention have been shown and described, simply by way of illustration. As those skilled in the art would realize, the described embodiments may be modified in various different ways, all without departing from the spirit or scope of the present disclosure.

Accordingly, the drawings and description are to be regarded as illustrative in nature and not restrictive. Like reference numerals designate like elements throughout the specification. In addition, a singular form may be intended to include a plural form as well, unless an explicit expression such as "one" or "single" is used. Terms including ordinal numbers such as first, second, and the like will be used only to describe various constituent elements, and are not to be interpreted as limiting these constituent elements. These terms may be used for a purpose of distinguishing one constituent element from other constituent elements.

FIG. 1 illustrates a block diagram of a memory device according to an embodiment. The memory device 100 may be a volatile memory device, such as a dynamic random access memory (DRAM), which includes a double data rate synchronous dynamic random access memory (DDR SDRAM), a low power double data rate SDRAM (LPDDR SDRAM), a graphics double data rate SDRAM (GDDR SDRAM), a Rambus DRAM (RDRAM), and the like. However, this is only an example, and the type of the memory device 100 may not be limited thereto.

The memory device 100 may respond to a control command signal CMD and an address signal ADDR received from an external host, such as a central processing unit (CPU), an application processor (AP), or a system on chip (SoC), and may store data received through a data signal DQ or may output data as the data signal DQ.

As shown by FIG. 1, the memory device 100 may include a control logic 110, a row decoder 130, a sub-cell array 150, a sense amplifier 151, a column decoder 170, and an I/O gating circuit 190. The sub-cell array 150 may include a plurality of memory cells MC, and the memory cells may be provided within a plurality of memory banks 150a to 150h (Bank 0-h). Although eight memory banks 150a to 150h are illustrated in FIG. 1, the number of the memory banks is not limited thereto. Each of the memory banks 150a to 150h may include a plurality of memory cells MC arranged into a two-dimensional array having a plurality of intersecting rows and columns of memory cells therein. In the embodiments, the plurality of rows may be defined by a plurality of word lines WL, and the plurality of columns be defined by a plurality of bitlines BL.

The control logic 110 controls an operation of the memory device 100. For example, the control logic 110 may generate a control signal so that the memory device 100 performs a read operation, a write operation, an offset calibration operation, and the like. In the embodiment, the control logic 110 may receive the control command signal CMD and the address signal ADDR from an external host. The address signal ADDR may include a row address RA indicating a row in the sub-cell array 150 and a column address CA indicating a column in the sub-cell array 150. The row address RA may be provided to the row decoder 130, and the column address CA may be provided to the column decoder 170. In response, the row decoder 130 may select at least one of the plurality of word lines WL by referring to a row address, and the column decoder 170 may select at least one of the plurality of bitlines BL by referring to a column address.

The row decoder 130 may select a row to be activated from among the plurality of rows of the sub-cell array 150 based on the row address RA. To this end, the row decoder 130 may apply a driving signal having a voltage to a word line corresponding to a row to be activated. In the embodiment, a plurality of row decoders 130a to 130h corresponding to the plurality of memory banks 150a to 150h may be provided.

The column decoder 170 may select a column to be activated from among the plurality of columns of the sub-cell array 150 based on the column address CA. To this end, the column decoder 170 may activate the sense amplifier 151 corresponding to the column address CA through the I/O gating circuit 190. In the embodiment, a plurality of column decoders 170a to 170h respectively corresponding to the plurality of memory banks 150a to 150h may be provided.

In the embodiment, the I/O gating circuit 190 may gate input/output data, and may include a data latch for storing data read from the sub-cell array 150 and a write driver for writing data to the sub-cell array 150. Data read from the sub-cell array 150 may be sensed by the sense amplifier 151 and stored in the I/O gating circuit 190, which may operate as a data latch.

In the embodiment, a plurality of sense amplifiers 151a to 151h respectively corresponding to the plurality of memory banks 150a to 150h may be provided. The sense amplifier 151 may sense and amplify data of a memory cell connected to the selected bitline BL. The sense amplifier 151 may output data read from the memory cell to the outside through the I/O gating circuit 190.

On the other hand, in order to prevent data stored in the memory cell MC from being lost, a memory device such as a DRAM needs a refresh operation, which includes periodically sensing and amplifying the data of the memory cell MC and restoring it to the memory cell MC. Specifically, the refresh operation of the DRAM includes a row active operation and a row precharge operation. The low active operation consists of an operation in which when the row active signal is enabled, the word line WL selected by the row address is activated, and the data stored in the memory cell is transmitted to the bit line BL, sensed and amplified by the operation of the sense amplifier 151, and stored again in the memory cell MC. The row precharge operation consists of an operation in which the word line WL selected by the row precharge command is disabled and the data stored again in the memory cell MC is maintained for a certain period of time. In the DRAM, a period in which a row active signal is activated and a row active operation occurs is defined as tRAS, and a period in which a row precharge operation occurs is defined as tRP. For the refresh operation of the DRAM, tRAS and tRP must be longer than the minimum required times tRAS(min) and tRP(min), respectively.

Figure 2:
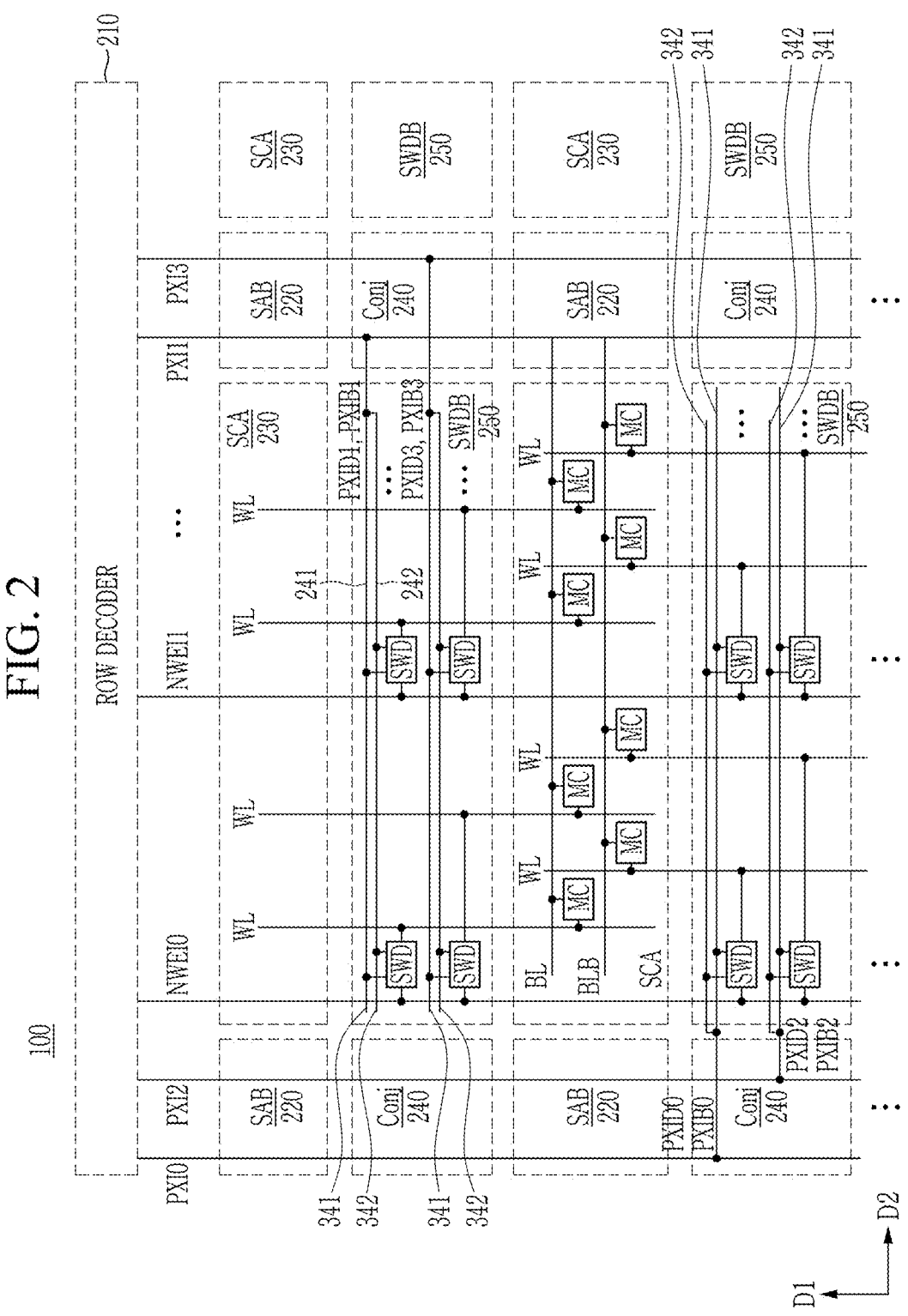
FIG. 2 illustrates a layout of a memory device according to an embodiment.

FIG. 2 illustrates a layout of a memory device according to an embodiment. Referring to FIG. 2, the memory device 100 may include a plurality of sense amplifier blocks (SAB) 220, a plurality of sub-cell arrays (SCA) 230 in which a plurality of memory cells are disposed, a plurality of connection circuit blocks (Conj) 240, and a plurality of sub-word line driver blocks (SWDB) 250.

The plurality of sub-word line driver blocks 250 may be disposed between the plurality of sub-cell arrays 230, and aligned (arranged in a line) along a first direction, which is shown in FIG. 2 as D1, and the plurality of sense amplifier blocks 220 may be disposed between the plurality of sub-cell arrays 230, and aligned along a second direction D2, which is orthogonal to the first direction D1. The plurality of connection circuit blocks 240 may be disposed between the plurality of sub-word line blocks 250 in the second direction D2 and between the plurality of sense amplifier blocks 220 in the first direction D1.

Referring to FIG. 2, the row decoder 210 may respond to the row address RA inputted from the outside to output word line enable signals NWEI0 and NWEI1 and pre-decoding signals PXI0 to PXI3 for enabling selected word lines among the word lines WL. Each of the connection circuit blocks 240 may provide driving signals (PXID0, . . . , PXID3, PXIB0, . . . , PXIB3) based on the pre-decoding signals (PXI0, . . . , PXI3) to a sub-word line driver block SWDB. For example, the connection circuit blocks 240 may provide first driving signals (PXID0, . . . , PXID3) and complementary second driving signals (PXIB0, . . . , PXIB3) to the sub-word line driver block SWDB. Each of the connection circuit blocks 240 may output a first driving signal PXID1 through a first driving signal line 241, and may output a second driving signal PXIB1 through a second driving signal line 242. In the embodiment, in addition, each of the connection circuit blocks 240 may supply a voltage higher than a power voltage, for example, a boosted voltage VPP, to a selected word line, and may apply a voltage lower than a ground voltage, for example, a back bias voltage VBB, to an unselected word line, but the present disclosure is not limited thereto.

Each of the sub-word line driver blocks 250 may include a plurality of sub-word line drivers SWD. The sub-word line driver SWD may be connected to a plurality of word lines WL connected to memory cells MC disposed in the sub-cell array 230, respectively. That is, when the word line WL is driven by the sub-word line driver SWD and a bit line among bit lines BL and BLB is selected, one of the memory cells MC corresponding thereto may be accessed. In the embodiment, an access operation mode may include a read operation and a write operation.

The plurality of sense amplifier blocks 220 may include a plurality of sense amplifiers. In the embodiment, the plurality of sense amplifiers may correspond to the sense amplifiers 151 shown in FIG. 1. In particular, during a read operation of the memory device 100, when the word line WL selected by the row address RA is enabled, the sense amplifier (151 in FIG. 1) is driven. When the sense amplifier (151 in FIG. 1) loads the sensed cell data on the corresponding bit line BL, the column address CA is selected, so that the cell data is outputted to the outside through the I/O gating circuit (190 in FIG. 1).

Figure 3:
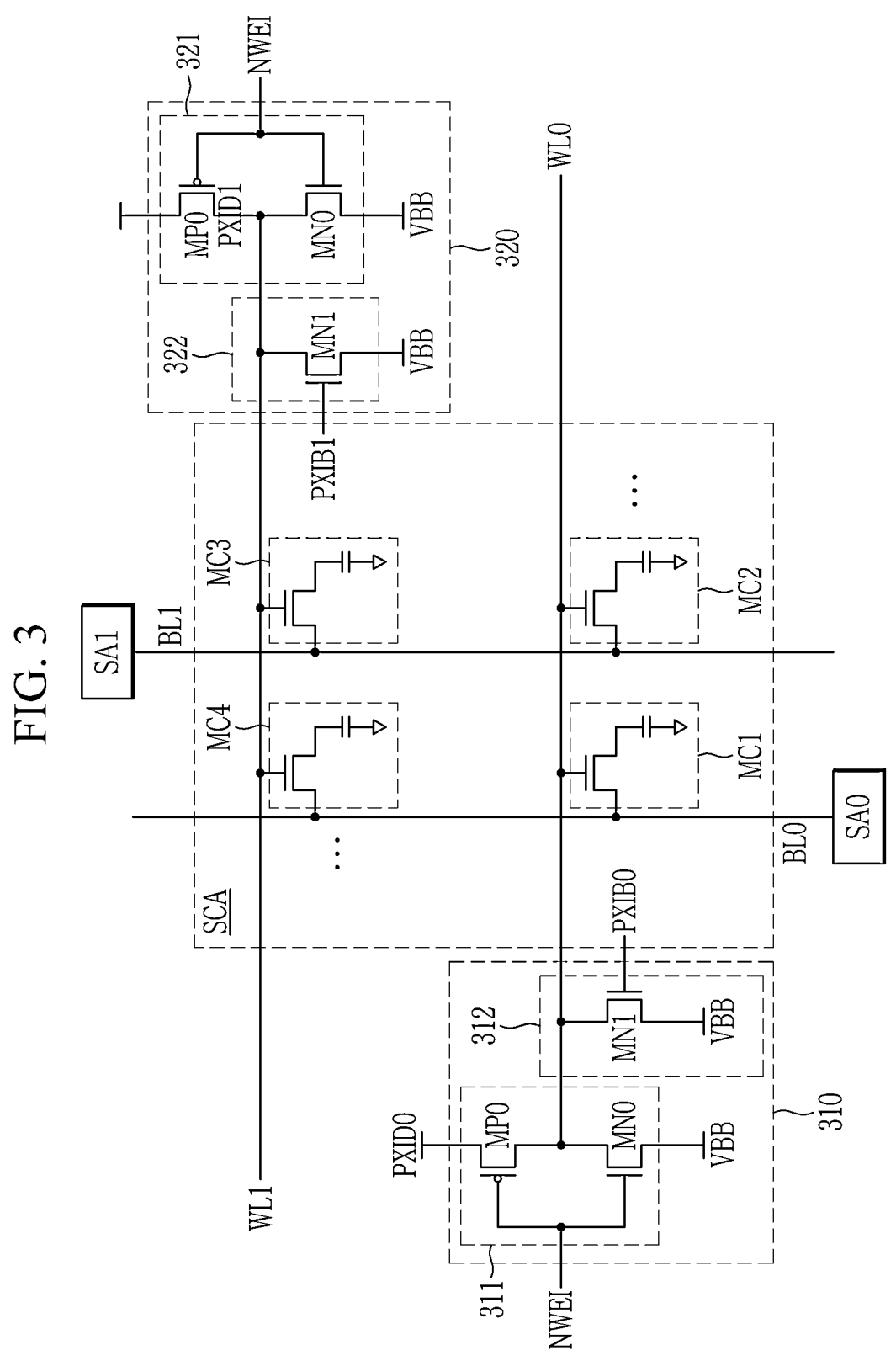
FIG. 3 illustrates a circuit diagram of a sub-word line driver.

FIG. 3 illustrates a circuit diagram of a sub-word line driver. Referring to FIG. 3, the memory device may include a first sub-word line driver 310 connected to a first word line WL0, a second sub-word line driver 320 connected to a second word line WL1, a first sense amplifier SA0 connected to a first bit line BL0, and a second sense amplifier SA1 connected to a second bit line BL1. Memory cells MC1 to MC4 may be connected to the word lines WL0 and WL1 and the bit lines BL0 and BL1, and the memory cells MC1 to MC4 may be disposed in a sub-cell array SCA.

The first sub-word line driver 310 and the second sub-word line driver 320 may be disposed in different sub-word line driver blocks SWDB. The first sub-word line driver 310 and the second sub-word line driver 320 may have the same structure. As shown, the sub-word driver 310 may include a driver circuit 311 and a pull-down circuit 312. The driver circuit 311 may include a PMOS transistor MPO and a first NMOS transistor MN0. Specifically, in the PMOS transistor MPO, the driving signal PXID0 may be connected to a source terminal, the word line enable signal NWEI may be connected to a gate terminal, and the first word line WL0 may be connected to a drain terminal. The PMOS transistor MPO may be a pull-up transistor, and may drive the first word line WL0 connected to a drain terminal in response to the word line enable signal NWEI and the driving signal PXID0. In the first NMOS transistor MN0, a precharge voltage corresponding to the back bias voltage VBB may be connected to a source terminal, the word line enable signal NWEI may be connected to a gate terminal, and the first word line WL0 may be connected to a drain terminal. The first NMOS transistor MN0 may be a pull-down transistor.

The pull-down circuit 312 may include a second NMOS transistor MN1. In the second NMOS transistor MN1, the complementary driving signal PXIB0 may be connected to a gate terminal, the precharge voltage corresponding to the back bias voltage VBB may be connected to a source terminal, and the first word line WL0 may be connected to a drain terminal. The second NMOS transistor MN1 may be a keeping transistor for maintaining the corresponding word line at a back bias voltage (VBB) level when the first word line WL0 is not selected.

The sub-word line drivers 310 and 320 shown in FIG. 3 are illustrated as using the PMOS transistor MPO as a pull-up transistor and the NMOS transistors MN0 and MN1 as a pull-down transistor and a keeping transistor, but are not limited thereto. However, in the following description, it is assumed that the sub-word line drivers 310 and 320 use the PMOS transistor MPO as a pull-up transistor and the NMOS transistors MN0 and MN1 as a pull-down transistor and a keeping transistor.

Similar to the driver circuit 311 and the pull-down circuit 312 of the sub-word line driver 310, the sub-word line driver 320 may be connected to the word line WL1, and may include a driver circuit 321 and a pull-down circuit 322. The sub-word line driver 320 may have the same or similar structure and perform the same or similar operation as described above with respect to the sub-word line driver 310.

Figure 4:
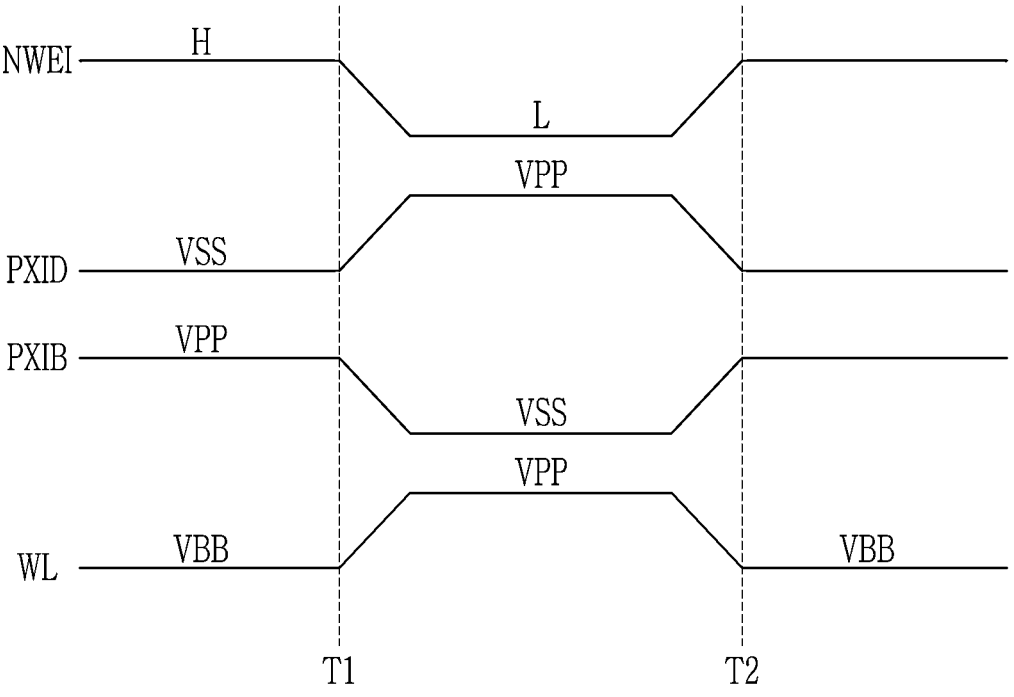
FIG. 4 illustrates an operation of a sub-word line driver of a memory device using a timing diagram, according to an embodiment.

FIG. 4 illustrates an operation of a sub-word line driver. Referring to FIG. 4, the sub-word line driver SWD may drive the word line WL with the boosted voltage VPP or the back bias voltage VBB according to the word line enable signal NWEI.

The sub-word line driver SWD may pull up or pull down the voltage of the word line WL according to the word line enable signal NWEI. For example, before a first time point T1, the word line enable signal NWEI may have a high (H) level in an inactive state; from the first time point T1 to a second time point T2, the word line enable signal NWEI may have a low (L) level in an active state; and, after the second time point T2, the word line enable signal NWEI may return to the high (H) level.

Before the first time point T1, the driving signal PXID may have a low level, for example, the ground voltage VSS, and the complementary driving signal PXIB may have a high level, for example, the boosted voltage VPP. When the word line enable signal NWEI is in an inactive state, the word line WL may be maintained at the back bias voltage VBB. However, this is merely an example, and the operation may not be limited thereto.

When a memory cell is accessed, the word line enable signal NWEI and the driving signal PXID corresponding to the memory cell may be activated. The sub-word line driver SWD may provide the boosted voltage VPP provided through the driving signal PXID to the word line WL as the word line enable signal NWEI is activated at the low (L) level. Accordingly, the sub-word line driver SWD may drive the word line WL with the boosted voltage VPP.

In the embodiment, when the word line enable signal NWEI is activated at the low (L) level at the first time point T1, the driving signal PXID may transition to the boosted voltage VPP, and the complementary driving signal PXIB may transition to the low level, for example, the ground voltage VSS. At the first time point T1, the PMOS transistor MPO corresponding to the pull-up transistor of the sub-word line driver SWD may be turned on, and the first NMOS transistor MN0 corresponding to the pull-down transistor may be turned off. In addition, as the complementary driving signal PXIB is maintained at the low level, the second NMOS transistor MN1 corresponding to the keeping transistor may be turned off. Accordingly, the word line WL and the source terminal of the second NMOS transistor MN1 may be electrically disconnected, while the word line WL and the source terminal of the PMOS transistor MPO may be electrically connected, such that the driving signal PXID having the boosted voltage level VPP may be supplied to the word line WL.

When the memory cell access operation is completed, the sub-word line driver SWD may precharge the word line WL with the back bias voltage VBB. For example, the back bias voltage VBB may be a precharge voltage, however, this is only one example, and the precharge voltage is not limited thereto, and may be higher than the back bias voltage VBB and lower than the ground voltage VSS.

In the embodiment, when the word line enable signal (NWEI) is deactivated at the high (H) level at the second time point T2, the driving signal PXID may transition to the low (L) level, that is, the ground voltage VSS level, and the complementary driving signal PXIB may transition to the high (H) level.

As the complementary driving signal PXIB transitions to the high level, the second NMOS transistor MN1 may be turned on, and the source terminal of the second NMOS transistor MN1 may be electrically connected to the word line WL. In addition, as the driving signal PXID transitions to the ground voltage (VSS) level, the PMOS transistor MPO may be turned off, and the source terminal of the PMOS transistor MPO and the word line WL may be electrically disconnected. Accordingly, the voltage of the word line WL may decrease to a precharge voltage corresponding to the back bias voltage VBB.

In addition, the second NMOS transistor MN1 included in the sub-word line driver SWD may maintain the word line WL at the back bias voltage after the precharge operation. Accordingly, the word line WL may maintain a stable voltage despite fluctuations or noise of the word line enable signal NWEI. Referring to FIG. 2 and FIG. 3, the word lines WL may share the word line enable signals NWEI in units of four or eight. For example, the sub-word line drivers 310 and 320 connected to the word lines WL0 and WL1 may receive the same word line enable signal NWEI. Therefore, the first word line WL0 connected to the first sub-word line driver 310 and the second word line WL1 connected to the second sub-word line driver 320 may be enabled or disabled by the same word line enable signal NWEI. In addition, the sub-word line drivers 310 and 320 receiving the same word line enable signal NWEI may be enabled or disabled by the driving signals PXID0, PXIB0, PXID1, and PXIB1 having different voltage levels. For example, even if the same word line enable signal NWEI is received, the first word line WL0 may be enabled by the driving signal PXID0 of the boosted voltage VPP, and the second word line WL1 may be disabled by the driving signal PXIB1 of the back bias voltage VBB. In this case, a voltage of the disabled word line (for example, WL1) adjacent to the enabled word line (for example, WL0)

may be unintentionally changed due to an undesired parasitic coupling effect between the word lines. For example, if a node at which the sub-word line driver SWD connected to the word line WL1 is a start point of the word line WL1, an end point of the word line WL1 is adjacent to the sub-word line driver SWD of the adjacent word line (for example, WL0). Accordingly, a region in which the effect of parasitic coupling between the word lines is relatively higher is at the start point and at the end point of the word lines.

Figure 5:
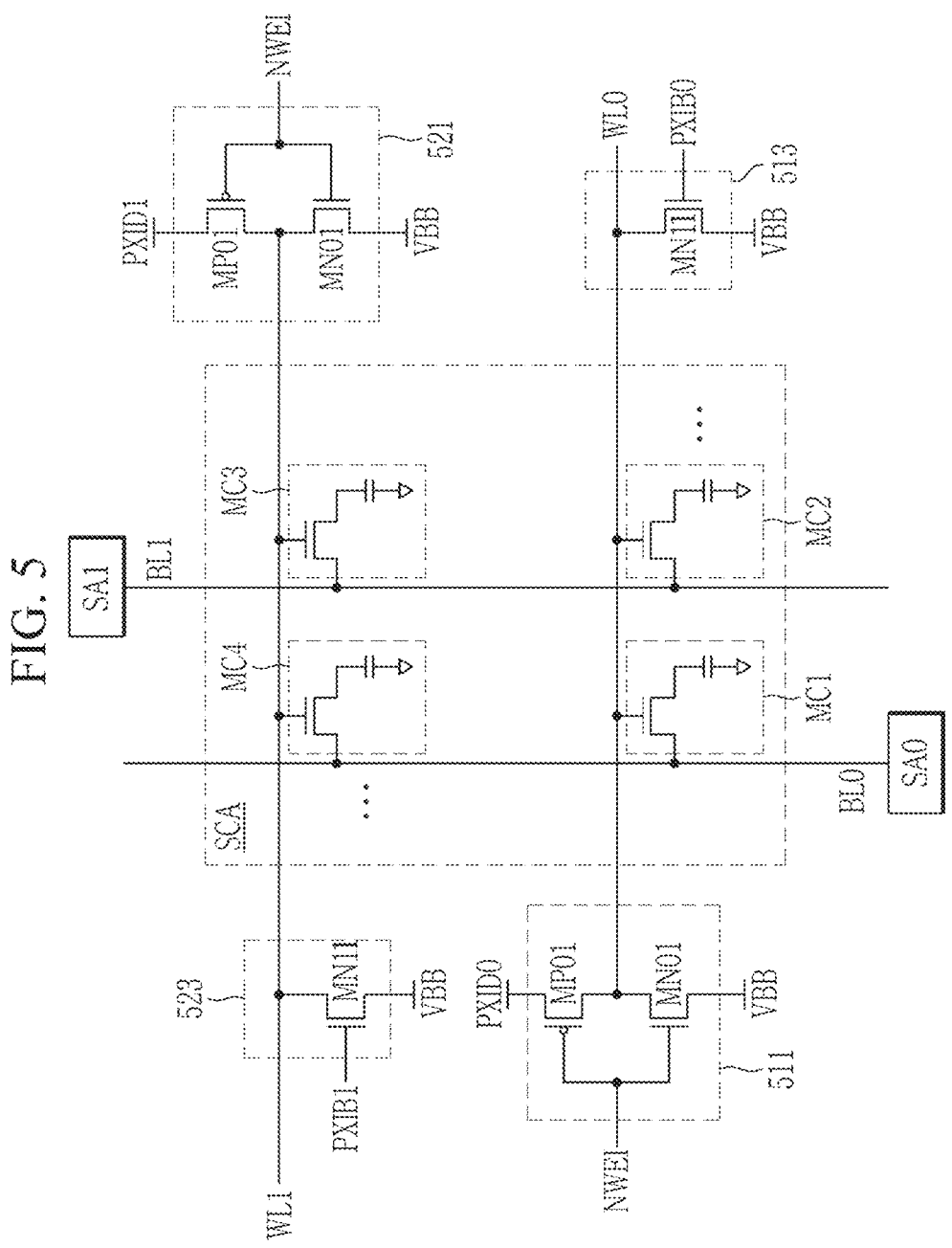
FIG. 5 illustrates a structure of a sub-word line driver according to an embodiment.

FIG. 5 illustrates a structure of a sub-word line driver according to an embodiment. The first sub-word line driver SWD connected to the first word line WL0 according to the embodiment may include a driver circuit 511 and a pull-down circuit 513. The driver circuit 511 may include a PMOS transistor MP01 and a first NMOS transistor MN01, and the pull-down circuit 513 may include a second NMOS transistor MN11. The PMOS transistor MP01 and the first NMOS transistor MN01 of the driver circuit 511 may be connected in series, and the second NMOS transistor MN11 of the pull-down circuit 513 may be connected in parallel to the first NMOS transistor MN01. In the embodiment, the driver circuit 511 and the pull-down circuit 513 may be disposed in different sub-word line driver blocks SWDB.

In the embodiment, the pull-down circuit 513 of the first sub-word line driver SWD connected to the first word line WL0 may be spaced apart from the driver circuit 511. For example, when the driver circuit 511 is connected to one end of the first word line WL0, the pull-down circuit 513 may be connected to the other end of the first word line WL0. For example, when a point at which the driver circuit 511 is connected to the first word line WL0 is defined as a start point of the first word line WL0, the pull-down circuit 513 may be connected to an end point of the first word line WL0. In the embodiment, a plurality of memory cells MC1 and MC2 connected to the first word line WL0 and the bit lines BL0 and BL1 may be disposed between the driver circuit 511 and the pull-down circuit 513 connected to the first word line WL0 along one direction. For example, the driver circuit 511, the plurality of memory cells MC1 and MC2, and the pull-down circuit 513 may be disposed along an extension direction of the first word line WL0.

In the embodiment, the second sub-word line driver SWD connected to the second word line WL1 may include a driver circuit 521 and a pull-down circuit 523. A structure of the second sub-word line driver may be the same as that of the first sub-word line driver. According to the sub-word line driver of the embodiment, compared to the sub-word line driver of FIG. 3, the position of the second NMOS transistor MN11 for applying the back bias voltage VBB to the word lines WL0 and WL1 is changed to the end point of the word lines WL0 and WL1, so that the effect of coupling between the disable time of the word lines WL0 and WL1 and the word lines may be improved.

Figure 6:
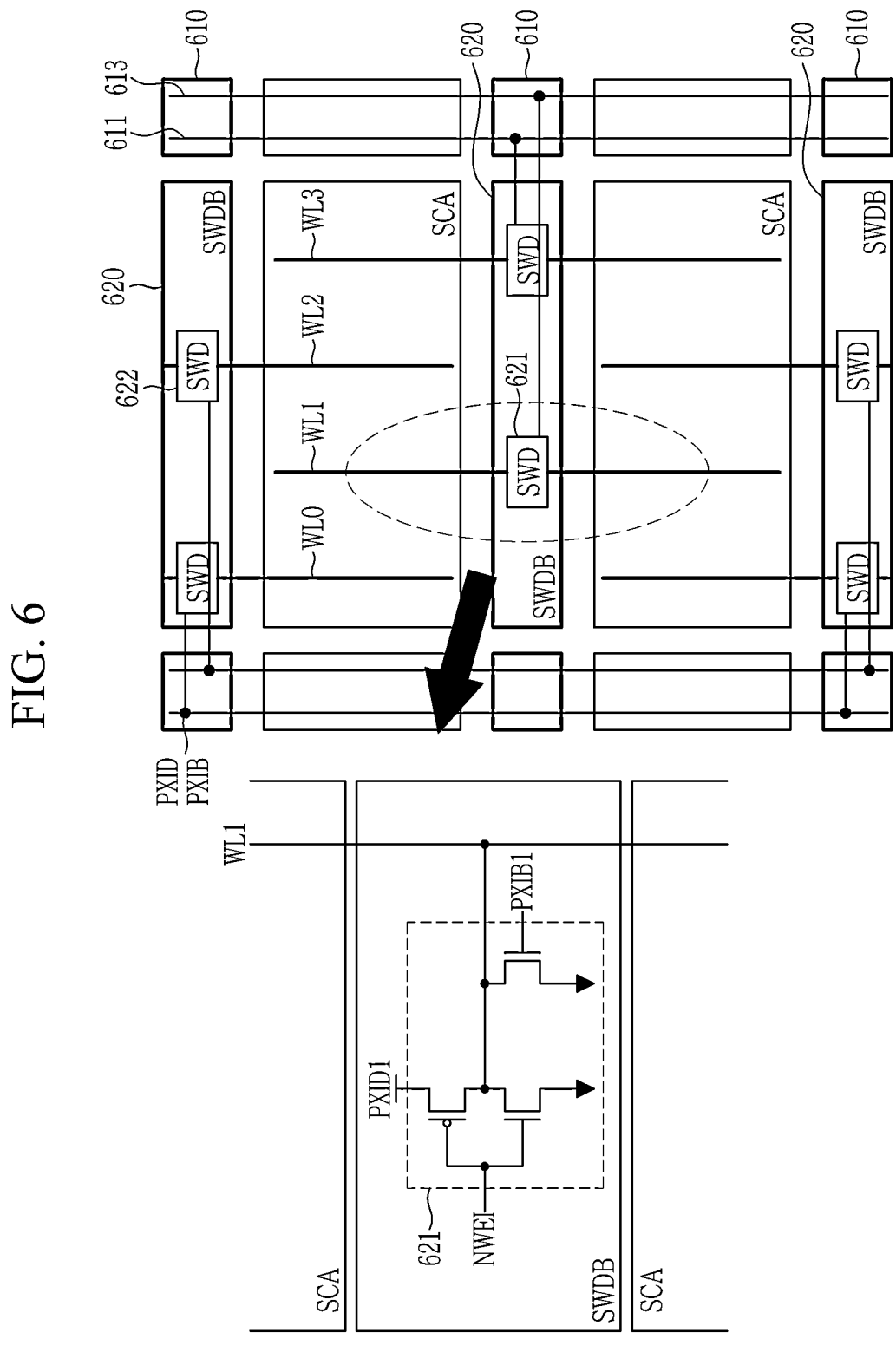
FIG. 6 illustrates a circuit block diagram of a memory device according to a structure of a sub-word line driver.

FIG. 6 illustrates a circuit block diagram of a memory device according to a structure of a sub-word line driver. Referring to FIG. 6, the memory device may include connection circuit blocks 610 including a driving signal generation circuit for generating driving signals PXID and PXIB, sub-word line driver blocks (SWDB) 620 including sub-word line drivers (SWD), and a sub-cell array (SCA) 630 in which a plurality of memory cells are disposed. A sub-word line driver 621 may be disposed within one sub-word line driver block SWDB. The sub-word line driver 621 is connected to the word line WL1, and it may drive the word line WL1 when the word line WL1 is selected or may maintain the word line WL1 at the precharge voltage corresponding to the back bias voltage VBB when the word line WL1 is not selected.

The plurality of sub-word line drivers SWD are distributed so as to drive each corresponding word line within a predetermined time. Moreover, in order to more efficiently layout the sub-word line drivers SWD and achieve improved performance, the sub-word line drivers SWD driving word lines that are adjacent to each other may be disposed in a zigzag pattern at upper and lower sides of a corresponding central sub-cell array 630. For example, as highlighted in FIG. 6, the sub-word line driver 621 that drives the second word line WL1 may be disposed at the lower side of the sub-cell array 630, whereas a sub-word line driver 622 that drives the third word line WL2 adjacent to the second word line WL1 may be disposed at the upper side of the sub-cell array 630.

In addition, as described above, the sub-word line drivers SWD may be disposed such that most of the sub-word line drivers SWD may be connected to the word line extending in the first direction and in the second direction opposite to the first direction. But, this structure may have a problem in that the loading of the word line increases as the distance from the sub-word line driver SWD increases.

Alternatively, when the sub-word line drivers SWD that drive the word lines adjacent to each other are disposed in a zigzag form at the upper and lower sides of the sub-cell array 630, the end point of each word line is adjacent to the sub-word line driver SWD of the adjacent word line. Based on this advantageous structure, a region having the greatest effect of coupling between the word lines becomes the end point of the word line.

Figure 7:
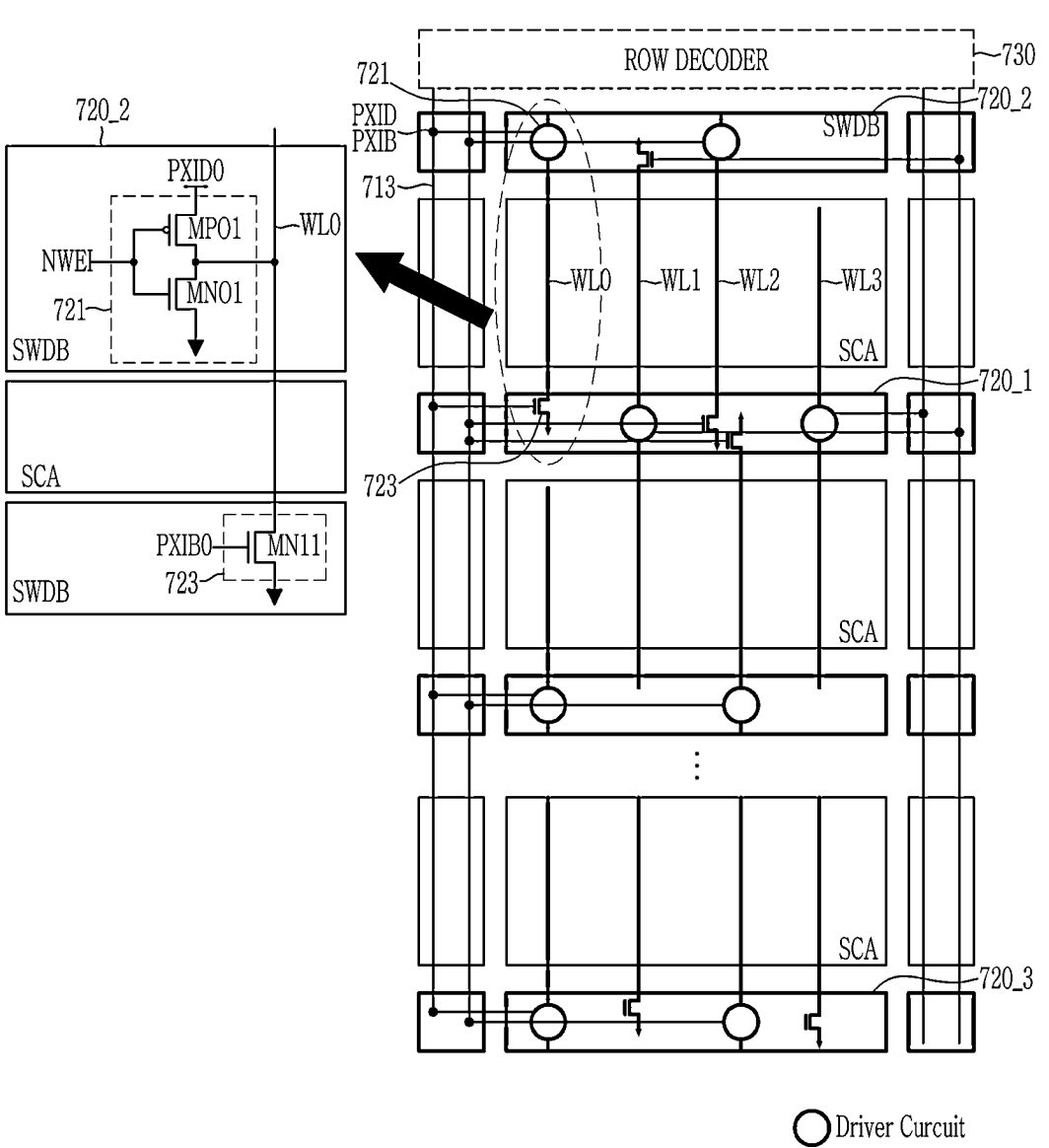
FIG. 7 illustrates a circuit block diagram of a memory device including a sub-word line driver according to an embodiment.

FIGS. 7 to 10 illustrate circuit block diagrams of memory devices including sub-word line drivers according to various embodiments. Referring to FIG. 7, the PMOS transistor MP01 and the first NMOS transistor MN01 of the sub-word line driver SWD may be disposed in a sub-word line driver block different from the second NMOS transistor MN11. In the embodiment, a driver circuit 721 including the PMOS transistor MP01 and the first NMOS transistor MN01 of the sub-word line driver may be disposed in a sub-word line driver block different from the pull-down circuit 723 including the second NMOS transistor MN11. For example, a pull-down circuit 723 may be disposed in a first sub-word line driver block 720_1, and the driver circuit 721 may be disposed in a second sub-word line driver block 720_2. In the embodiment, the driver circuit 721 may be disposed in the sub-word line driver block 720_2 closest to a row decoder 730. In the embodiment, the driver circuit 721 disposed in the sub-word driver block 720_2 closest to the row decoder 730 may be connected to the word line WL0 extending in one direction. This is the same when the driver circuit 721 of the first sub-word line driver is disposed in a sub-word line driver block 720_3 farthest from the row decoder 730. In the embodiment, when a point at which the driver circuit 721 is connected to the word line WL0 is defined as a start point of the word line WL0, the pull-down circuit 723 may be connected to an end point of the word line WL0. In the embodiment, when the driver circuit 721 is connected to one end of the word line WL0, the pull-down circuit 723 may be connected to the other end of the word line WL0. In this embodiment, a plurality of memory cells connected to the word line WL0 may be disposed between the driver circuit 721 and the pull-down circuit 723 connected to the word line WL0 along one direction.

Figure 8:
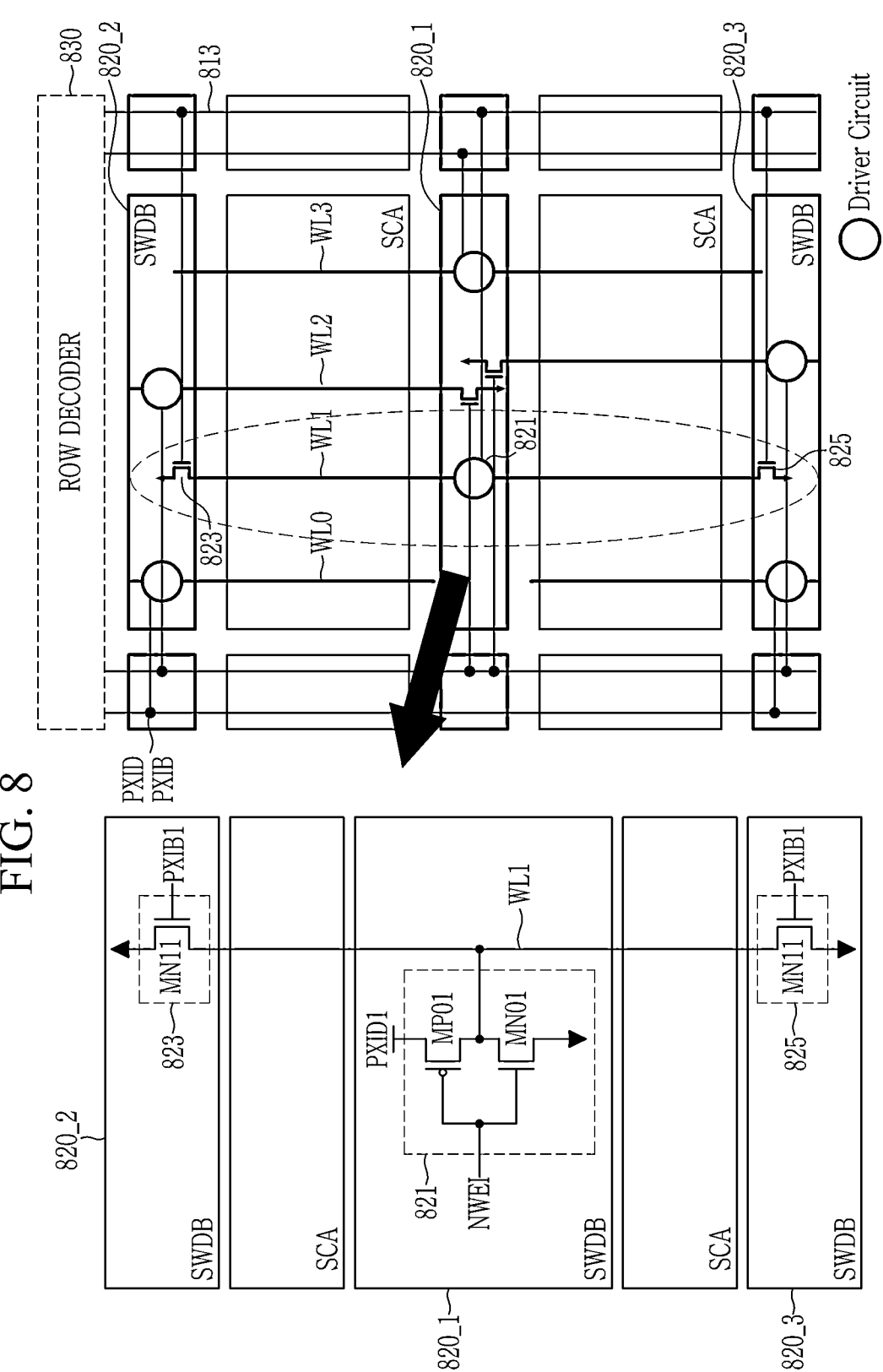
FIG. 8 illustrates a circuit block diagram of a memory device including a sub-word line driver according to an embodiment.

Referring to FIG. 8, the first sub-word line driver SWD driving the word line WL1 may include a pair of pull-down circuits 823 and 825 connected in parallel to a driver circuit 821. In the embodiment, most of the driver circuits may be connected to a word line extending in the first direction and the second direction opposite to the first direction centered on the driver circuit, except for the driver circuit disposed in the sub-word line driver block SWDB closest to or farthest from a row decoder 830. In the embodiment, the pull-down circuits 823 and 825 connected to the word line WL1 may be disposed in a sub-driver block different from the driver circuit 821. For example, the driver circuit 821 of the first sub-word line driver SWD may be disposed in a first sub-word line driver block 820_1, the pull-down circuit 823 of the first sub-word line driver may be disposed in a second sub-word line driver block 820_2, and the pull-down circuit 825 of the first sub-word line driver may be disposed in a third sub-word line driver block 820_3. In the embodiment, the word line WL1 may extend throughout the first sub-word line driver block 820_1, the second sub-word line driver block 820_2, and the third sub-word line driver block 820_3. In the embodiment, the pull-down circuits 823 and 825 connected to the word line WL1 may be connected to both ends of the word line WL1.

As described with reference to FIG. 6, when the word line WL extends in the first direction and the second direction opposite to the first direction with respect to the sub-word line driver SWD, as the distance from the sub-word line driver SWD increases, the loading of the word line WL may increase. According to the embodiment, when the driver circuit 721 is connected to one end of the word line WL0, an additional pull-down branch may be formed by connecting the pull-down circuit 723 to the other end of the word line WL0 or by connecting the pull-down circuits 823 and 825 to both ends of the word line WL1, which may advantageously increase the disable rate of the word line WL, and thereby improve the disable slope of the word line WL and secure a better tRP of the memory device.

In addition, due to the characteristic that the coupling effect between the word lines increases as the distance from the sub-word line driver SWD increases, the sub-word line driver SWD may reduce an effect of coupling between the word lines by disposing the pull-down circuits 823 and 825 for pull-down each at a respective end point of the word line. Particularly, in a memory device having a 3D structure in which a distance between the word lines is further narrowed, an effect of coupling between the word lines may be improved.

Figure 9:
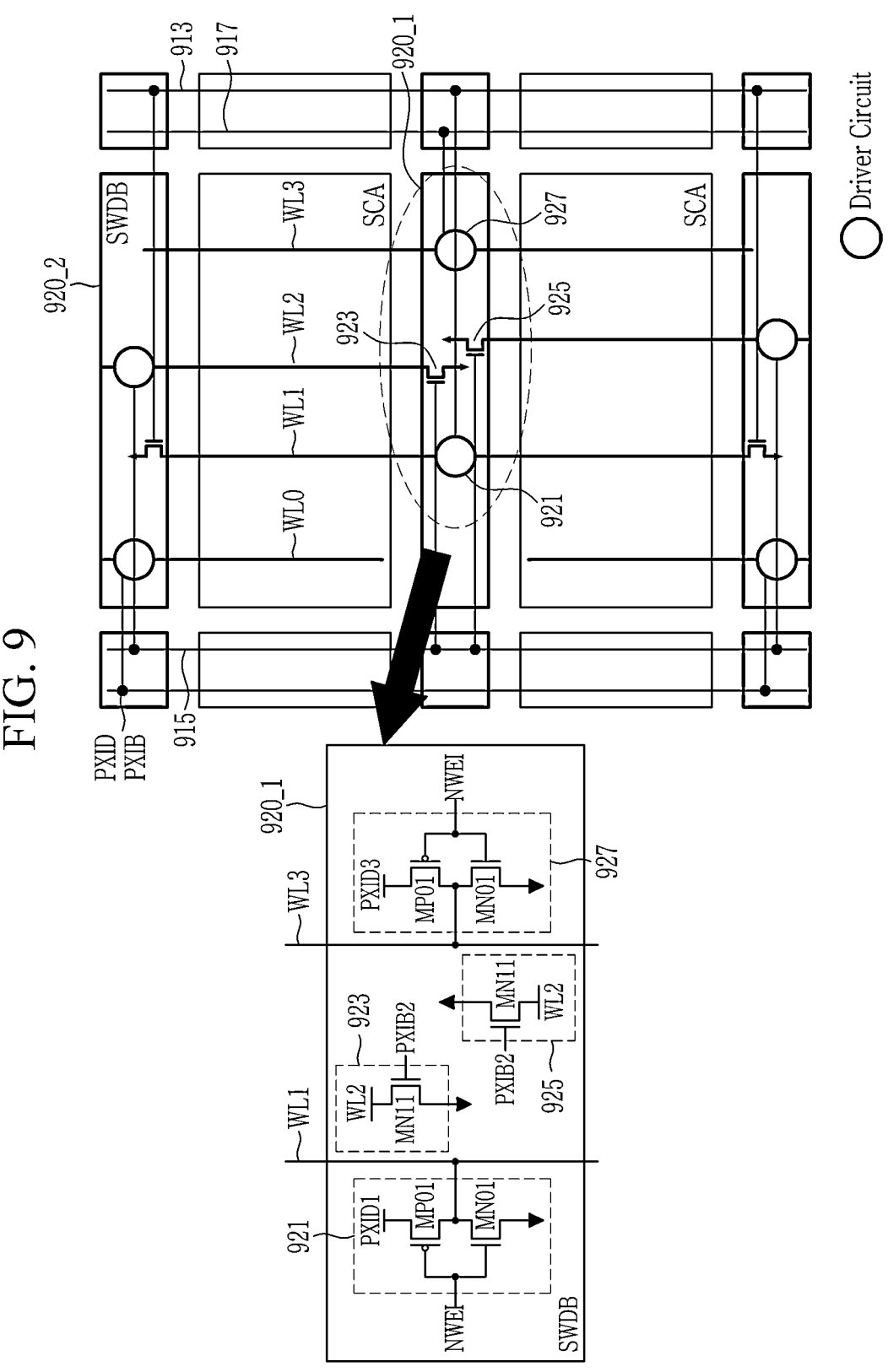
FIG. 9 illustrates a circuit block diagram of a memory device including a sub-word line driver according to an embodiment.

Referring to FIG. 9, a first sub-word line driver block 920_1 may include a first driver circuit 921 connected to the first word line WL1, pull-down circuits 923 and 925 connected to the second word line WL2 adjacent to the first word line WL1, and a third driver circuit 927 connected to the third word line WL3 adjacent to the second word line WL2. In the embodiment, a pull-down circuit connected to the same word line WL1 as the first driver circuit 921 may be disposed in a second sub-word line driver block 920_2.

Figure 10:
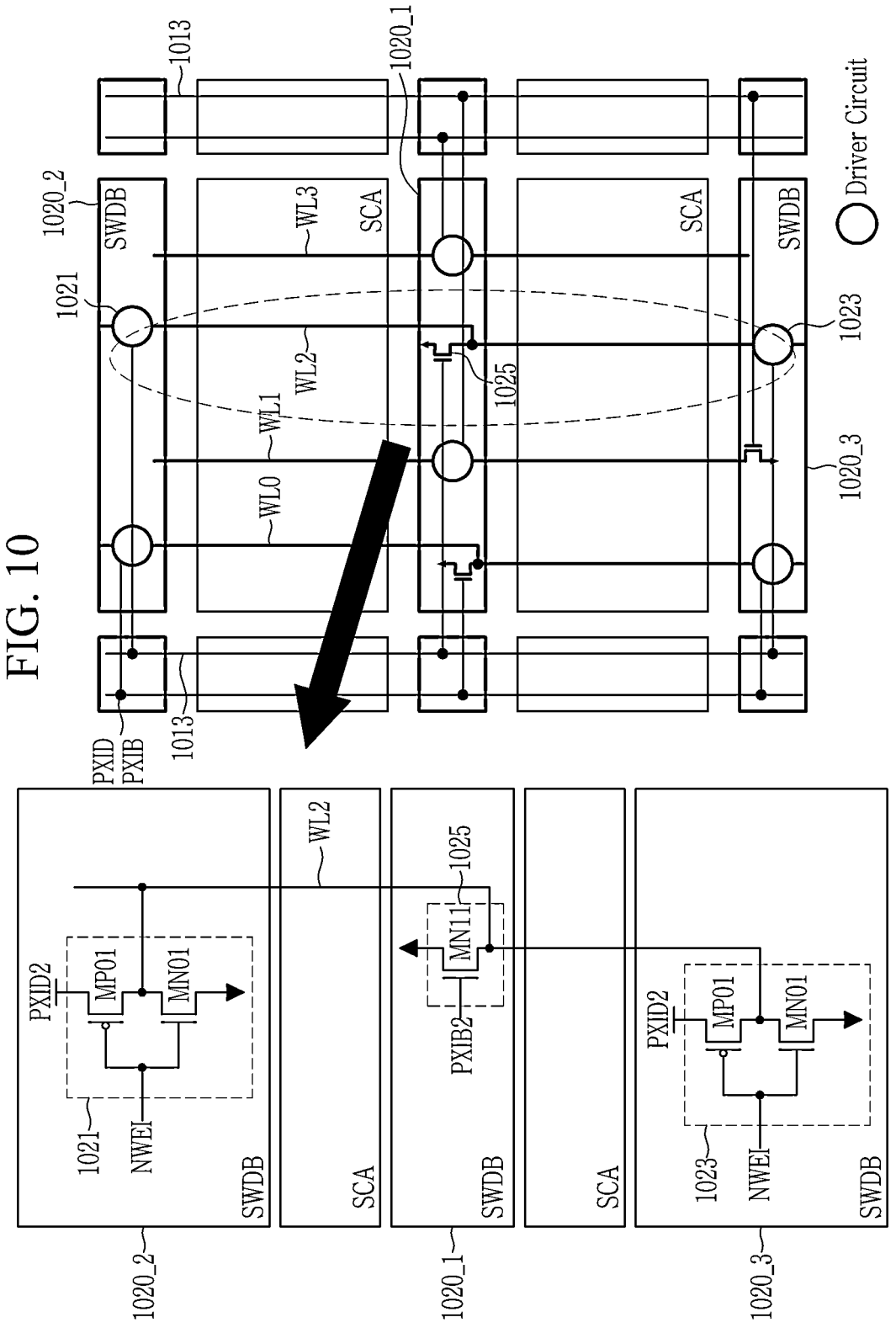
FIG. 10 illustrates a circuit block diagram of a memory device including a sub-word line driver according to an embodiment.

Referring to FIG. 10, the first sub-word line driver SWD connected to the word line, such as WL2, may include a first driver circuit 1021 and a first pull-down circuit 1025. In the embodiment, the driver circuit and the pull-down circuit of the first sub-word line driver can be disposed in different sub-word line driver blocks SWDB. For example, the first pull-down circuit 1025 of the first sub-word line driver may be disposed in a first sub-word line driver block 1020_1, whereas the first driver circuit 1021 of the first sub-word line driver may be disposed in a second sub-word line driver block 1020_2. In this embodiment, the second driver circuit 1023 may be connected to the first pull-down circuit 1025.

The second driver circuit 1023 and the first pull-down circuit 1025 may also be disposed in different sub-word line driver block 1025. For example, the second driver circuit 1023 may be disposed in a third sub-word line driver block 1020_3, and the first pull-down circuit 1025 may be disposed in the first sub-word line driver block 1020_1. As shown, the plurality of spaced apart driver circuits 1021 and 1023 may be connected to the same pull-down circuit 1025, which is generally centrally located between the driver circuits 1021, 1023. Thus, in the illustrated embodiment, a plurality of sub-word line drivers may share one NMOS transistor MN11 as a keeping transistor, which acts as a pull-down transistor.

Although not shown here, in the embodiment, a sub-word line driver block SWDB disposed on the opposite side of the first sub-word line driver block 1020_1 (with the third sub-word line driver block 1020_3 as the center) may be further included. In this case, the word line WL2 may extend through the sub-word line driver block SWDB disposed on the opposite side of the first sub-word line driver block 1020_1 with the third sub-word line driver block 1020_3 as the center, and the sub-word line driver block SWDB may include a pull-down circuit connected to the word line WL2. Although not all are shown in FIGS. 7-10, each word line may have pull-down circuits connected at ends thereof.

Figure 11:
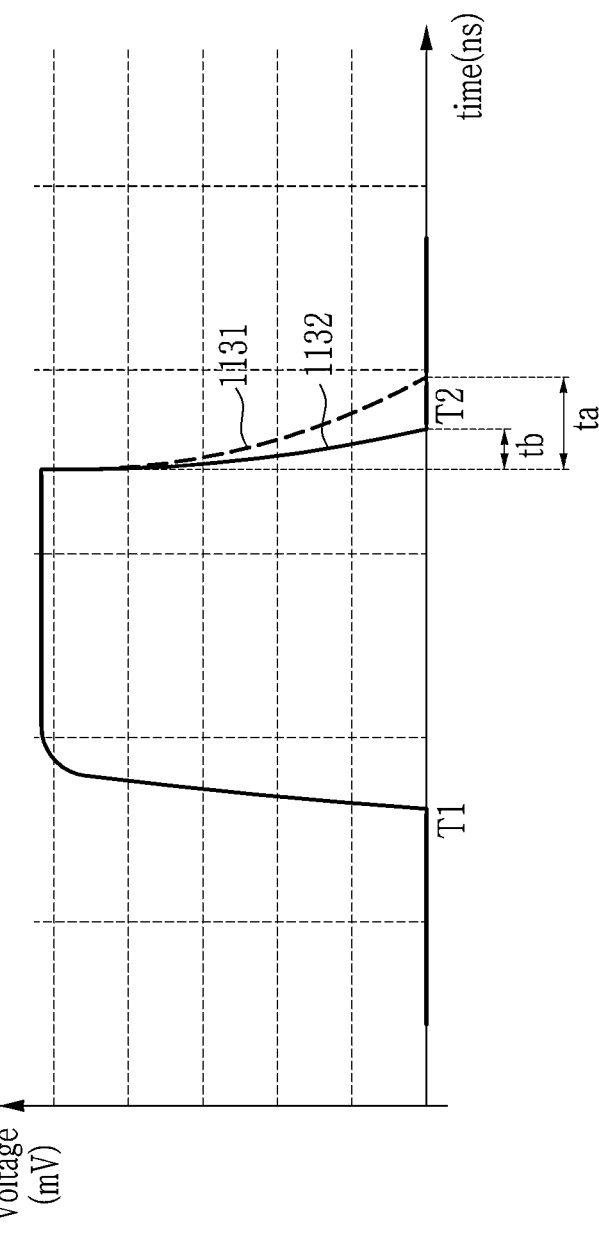
FIG. 11 illustrates a simulation result graph of a change in word line voltage according to an embodiment.

FIG. 11 illustrates a simulation result graph of a change in word line voltage according to a word line enable signal NWEI and a driving signal PXID. Referring to FIG. 11 together with FIG. 4, at a first time point T1, when the word line enable signal NWEI of the sub-word line driver SWD transitions from a high level to a low level and the driving signal PXID transition from a low level to a high level, the sub-word line driver SWD may drive the word line WL with the boosted voltage VPP. At a second time point T2, when the word line enable signal NWEI of the sub-word line driver SWD transitions from a low level to a high level and the driving signal PXID transitions from a high level to a low level, the sub-word line driver SWD may precharge the word line WL with the back bias voltage VBB via the ground voltage VSS.

Referring to FIG. 11, simulation results of a word line voltage 1131 by the sub-word line driver SWD of a comparative example and a word line voltage 1132 by the sub-word line driver SWD according to the embodiment of the present disclosure are illustrated together. At the second time point T2 when the word line enable signal NWEI of the sub-word line driver SWD transitions from a low level to a high level and the driving signal PXID transitions from a high level to a low level, a disable time "ta" in which the word line voltage by the structure of the sub-word line driver SWD of the comparative example is changed from the boosted voltage VPP to the back bias voltage VBB is 8.78 ns. At the second time point T2, a disable time "tb" of the word line by the structure of the sub-word line driver SWD according to the embodiment of the present disclosure is 1.21 ns. Thus, in the embodiment, an additional pull-down branch may be formed by disposing the NMOS transistor at the end point or both end points of the word line WL, which may improve the disable slope of the word line WL, as shown by FIG. 11 and the word line voltage curves 1131 relative to 1132.

Figure 12:
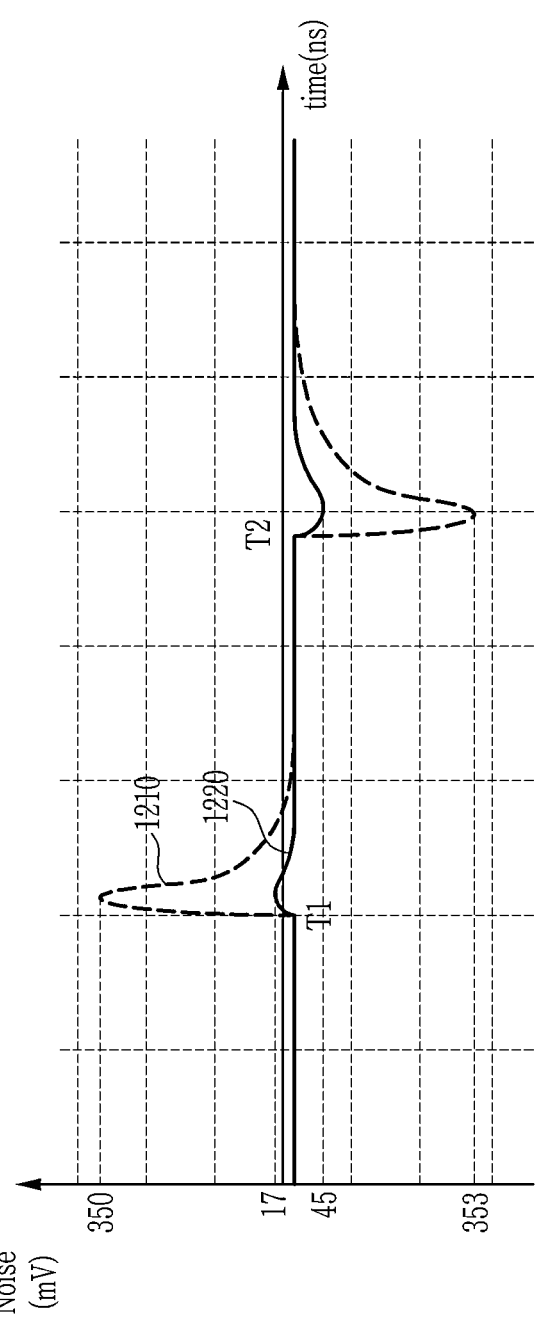
FIG. 12 illustrates a simulation result graph of coupling between word lines according to an embodiment.

FIG. 12 illustrates a simulation result graph of coupling noise 1210 between word lines by the sub-word line driver SWD of a comparative example and coupling noise 1220 between word lines by the sub-word line driver SWD according to an embodiment. As shown, at the first time point T1 when the word line enable signal NWEI of the sub-word line driver SWD transitions from a high level to a low level and the driving signal PXID transitions from a low level to a high level, the coupling noise 1210 between the word lines by the sub-word line driver SWD of the comparative example is 350 mV, whereas the coupling noise 1220 between the word lines by the sub-word line driver SWD according to an embodiment is much less, at only 17 mV.

At the second time point T2 when the word line enable signal NWEI of the sub-word line driver SWD transitions from a low level to a high level and the driving signal PXID transitions from a high level to a low level, the coupling noise 1210 between the word lines by the conventional sub-word line driver SWD is 353 mV, and the coupling noise 1220 between the word lines by the sub-word line driver SWD according to the embodiment is about 45 mV. Thus, according to the embodiment, coupling noise between the word lines may be improved significantly by disposing the NMOS "pull-down" transistors at the end point (or both end points) of the word line WL. This has the advantage of reducing the distance between the word lines and increasing the number of memory cells MC per bit line BL.

Figure 13:
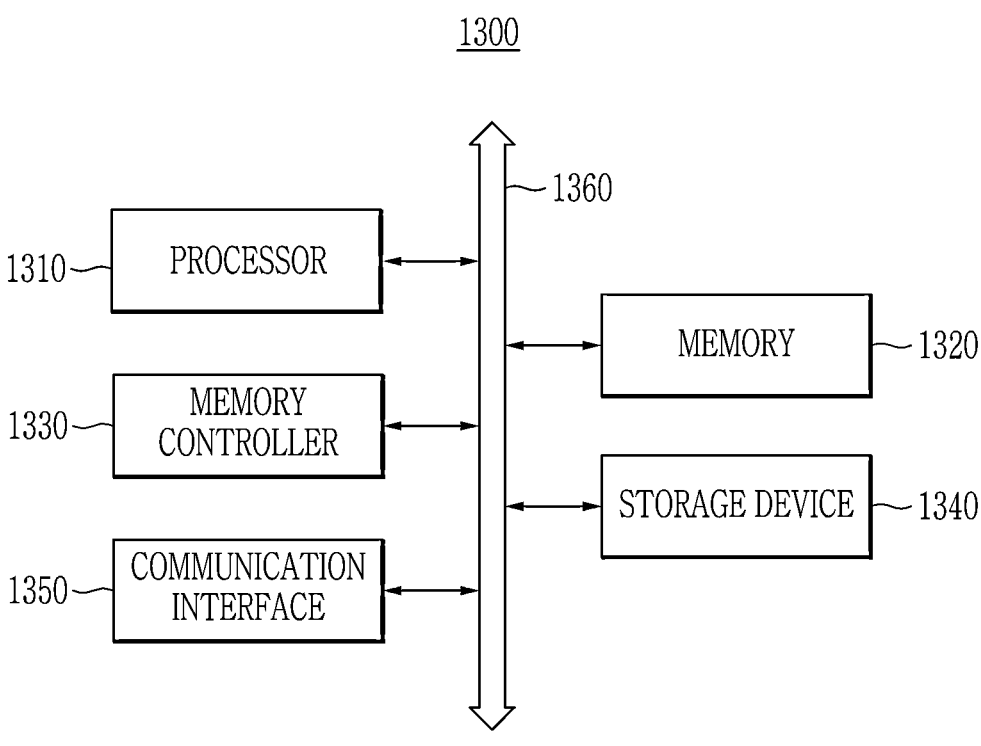
FIG. 13 illustrates a block diagram of a memory system according to an embodiment.

FIG. 13 illustrates a block diagram of a memory system according to an embodiment.

Referring to FIG. 13, a memory system 1300 includes a processor 1310, a memory 1320, a memory controller 1330, a storage device 1340, a communication interface 1350, and a bus 1360. The memory system 1300 may further include other general-purpose constituent elements.

The processor 1310 controls an overall operation of each constituent element of the memory system 1300. The processor 1310 may be implemented as at least one of various processing units such as a central processing unit (CPU), an application processor (AP), and a graphics processing unit (GPU).

The memory 1320 stores various data and commands. The memory 1320 may be implemented as the memory device described with reference to FIG. 7 to FIG. 10. In the embodiment, the memory 1320 may include a sub-word line driver SWD including a pull-up transistor, a pull-down transistor, and a keeping transistor. In the embodiment, the memory 1320 may include a sub-word line driver SWD in which a keeping transistor is connected to the other end of the word line WL when a pull-up transistor and a pull-down transistor are connected to one end of the word line WL. In the embodiment, the memory 1320 may include a sub-word line driver SWD in which pull-down transistors are connected to both ends of the word line WL. In the embodiment, the memory 1320 may include a sub-word line driver SWD in which a keeping transistor operates as a pull-down transistor. In the embodiment, the memory 1320 may include a plurality of sub-word line drivers SWD sharing one keeping transistor. The memory controller 1330 controls transmission of data or commands to and from the memory 1320.

The storage device 1340 non-temporarily stores programs and data. In the embodiment, the storage device 1340 may be implemented as a non-volatile memory. The communication interface 1350 supports wired and wireless Internet communication of the memory system 1300. In addition, the communication interface 1350 may support various communication methods other than Internet communication. The bus 1360 provides a communication function between constituent elements of the memory system 1300. The bus 1360 may include at least one type of bus according to a communication protocol between the constituent elements.

While the embodiment of the present disclosure has been described in connection with what is presently considered to be practical embodiments, it is to be understood that the disclosure is not limited to the disclosed embodiments, but, on the contrary, is intended to cover various modifications and equivalent arrangements included within the spirit and scope of the appended claims.

What is claimed is:

1. A semiconductor memory device, comprising:
a first word line extending in a first direction;
a sub-word line driver including:
   a first circuit and a second circuit that are connected to the first word line and are spaced apart from each other along the first direction; and
   a third circuit disposed on an opposite side of the first circuit, with the first circuit between the second circuit and the third circuit, and the third circuit being connected to the first word line,
   wherein the first circuit is configured to drive the first word line with a first voltage, the second circuit is configured to drive the first word line with a second voltage that is different from the first voltage, and the third circuit is configured to drive the first word line with the second voltage;
a first memory cell connected to the first word line and disposed between the first circuit and the second circuit along the first direction; and
a second memory cell connected to the first word line and disposed between the first circuit and the third circuit along the first direction.

2. The semiconductor memory device of claim 1, wherein the first circuit includes a first transistor connected between a first power supply and a first node to which the first word line is connected, and a second transistor that is connected to the first node and connected in series with the first transistor,
   wherein the second circuit includes a third transistor connected between the first node and a second power supply,
   wherein the first power supply is configured to supply the first voltage, and the second power supply is configured to supply the second voltage, and
   wherein the first voltage is higher than the second voltage.

3. The semiconductor memory device of claim 1, wherein the first circuit is connected to the first word line at one end of a first portion of the first word line, and
   the second circuit is connected to the first word line at the other end of the first portion of the first word line.

4. The semiconductor memory device of claim 1, wherein the second circuit is connected to the first word line at one end of a first portion of the first word line, and
   the third circuit is connected to the first word line at the other end of the first portion of the first word line.

5. The semiconductor memory device of claim 1, further comprising: a third memory cell connected to the first word line between the first circuit and the third circuit along the first direction.

6. The semiconductor memory device of claim 1, wherein the second circuit and the third circuit have the same structure.

7. The semiconductor memory device of claim 1, further comprising:
   a second word line that is adjacent to the first word line and extends in the first direction parallel to the first word line; and
   a second sub-word line driver including a fourth circuit connected to the second word line, driving the second word line with the first voltage, and disposed adjacent to the second circuit of the first word line in a second direction, and a fifth circuit connected to the second word line, driving the second word line with the second voltage, and disposed adjacent to the first circuit of the first word line in the second direction.

8. The semiconductor memory device of claim 1, wherein the first circuit is configured to drive the first word line with the first voltage based on a first driving signal and a word line enable signal, and wherein the second circuit is configured to drive the first word line with the second voltage based on a second driving signal, the second driving signal being complementary to the first driving signal at least when the word line enable signal has a voltage that disables the first word line.

9. A semiconductor memory device, comprising:
a first array of memory cells and a second array of memory cells;
a first word line electrically connected to a first memory cell within the first array of memory cells and a second memory cell within the second array of memory cells;
a first block extending adjacent a first side of the first array of memory cells, said first block including a first circuit connected to the first word line and configured to drive the first word line with a first voltage;
a second block extending adjacent a second side of the first array of memory cells that is opposite the first side, said second block including a second circuit connected to the first word line and configured to drive the first word line with a second voltage different from the first voltage; and
a third block including a third circuit connected to the first word line,
wherein the first word line extends through the first block, the second block, and the third block, and
wherein:
   the second block is between the first block and the third block with the second array of memory cells as a single array of memory cells between the second block and the third block, and the third circuit is configured to drive the first word line with the first voltage, or
   the first block is between the second block and the third block with the second array of memory cells as a single array of memory cells between the first block and the third block, and the third circuit is configured to drive the first word line with the second voltage.

10. The semiconductor memory device of claim 9, wherein the first circuit includes a pull-up transistor configured to pull-up the first word line to the first voltage, and the second circuit includes a pull-down transistor configured to pull-down the first word line to the second voltage.

11. The semiconductor memory device of claim 10, wherein:
   the third block is disposed on an opposite side of the first block with respect to the second block with the first block between the second block and the third block, and
   the third circuit is connected to the first word line and configured to drive the first word line with the second voltage.

12. The semiconductor memory device of claim 11, wherein the second circuit and the third circuit have the same structure.

13. The semiconductor memory device of claim 12, wherein the second circuit and the third circuit are connected to the first word line at one end and the other end of the first word line, respectively.

14. The semiconductor memory device of claim 10, wherein:

the third block is disposed on an opposite side of the second block with respect to the first block with the second block between the first block and the third block, and the third circuit is connected to the first word line and configured to drive the first word line with the first voltage.

15. The semiconductor memory device of claim 14, wherein the first circuit and the third circuit have the same structure.

16. The semiconductor memory device of claim 15, further comprising a fourth block disposed on an opposite side of the second block with respect to the third block, wherein the first word line extends through the fourth block, and wherein the fourth block includes a fourth circuit having a pull-down transistor connected to the first word line and configured to pull down the first word line to the second voltage.

17. The semiconductor memory device of claim 10, wherein the first circuit is connected to the first word line at one end of a first portion of the first word line, and the second circuit is connected to the first word line at the other end of the first portion of the first word line.

18. A memory system, comprising:

a cell array including a plurality of memory cells connected to a plurality of word lines;

a memory controller configured to generate an address signal;

a row decoder configured to receive the address signal, output a first signal that selects a first word line from among the plurality of word lines based on the address signal, and output a plurality of driving signals; and a first sub-word line driver including:

a first transistor connected to one end of the first word line, and configured to apply a first voltage to the first word line based on the first signal and a first driving signal among the plurality of driving signals, a second transistor configured to apply a second voltage different from the first voltage to the first word line based on the first signal; and a third transistor connected to the other end of the first word line and configured to apply the second voltage to the first word line based on a second driving signal complementary to the first driving signal.

19. The memory system of claim 18, further comprising:

a first sub-word line driver block disposed on a first side of the cell array and a second sub-word line driver block disposed on a second side of the cell array, the first side being opposite to the second side with respect to the cell array, wherein the first word line extends across the first sub-word line driver block, the cell array, and the second sub-word line driver block; and wherein the first transistor and the second transistor are disposed in the first sub-word line driver block, and the third transistor is disposed in the second sub-word line driver block.

20. The memory system of claim 19, wherein the row decoder is further configured to output a second signal selecting a second word line adjacent to the first word line among the plurality of word lines based on the address signal; and wherein the memory system further includes a second sub-word line driver including:

a first transistor that is connected to one end of the second word line, configured to apply the first voltage to the second word line based on the second signal and a third driving signal among the plurality of driving signals, and disposed in the second sub-word line driver block;

a second transistor that is configured to apply the second voltage to the second word line based on the second signal, and is disposed in the second sub-word line driver block; and a third transistor that is connected to another end of the second word line, configured to apply the second voltage to the second word line based on a fourth driving signal complementary to the third driving signal, and disposed in the first sub-word line driver block.

* * * * *